United States Patent
Grincourt et al.

(10) Patent No.: US 12,416,653 B2
(45) Date of Patent: Sep. 16, 2025

(54) SELECTION OF THE PHASE USED TO COMMUNICATE BY PLC

(71) Applicant: SAGEMCOM ENERGY & TELECOM SAS, Rueil Malmaison (FR)

(72) Inventors: Christophe Grincourt, Rueil Malmaison (FR); Marc Jeanrot, Rueil Malmaison (FR); Flavien Polverari, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 146 days.

(21) Appl. No.: 18/084,358

(22) Filed: Dec. 19, 2022

(65) Prior Publication Data
US 2023/0194583 A1  Jun. 22, 2023

(30) Foreign Application Priority Data
Dec. 20, 2021  (FR) ...................................... 2113979

(51) Int. Cl.
*G01R 22/06* (2006.01)
*H04B 3/54* (2006.01)

(52) U.S. Cl.
CPC ........... *G01R 22/063* (2013.01); *H04B 3/546* (2013.01)

(58) Field of Classification Search
CPC .............................. G01R 22/063; H04B 3/546
See application file for complete search history.

(56) References Cited

U.S. PATENT DOCUMENTS

| 2012/0175951 | A1* | 7/2012 | Pamulaparthy | ........... | H02J 3/26 307/11 |
| 2020/0295565 | A1* | 9/2020 | Dudding | ................ | G01D 4/004 |

FOREIGN PATENT DOCUMENTS

| EP | 2811262 A1 | | 12/2014 |
| EP | 2887557 A1 | | 6/2015 |
| TR | 201603396 A | * | 7/2016 |

* cited by examiner

*Primary Examiner* — Freshteh N Aghdam
(74) *Attorney, Agent, or Firm* — MUNCY, GEISSLER, OLDS & LOWE, P.C.

(57) ABSTRACT

Electricity meter, arranged to measure electrical energy supplied to an installation by a distribution network comprising a plurality of phases, the electricity meter including a communication module arranged to implement a communication by power-line communication; a switching circuit arranged to selectively connect the communication module to one of the phases; a processing unit arranged to control the switching circuit so as to connect the communication module to an optimised phase, from among the phases, which is selected dynamically to optimise a quality of the communication by power-line communication.

7 Claims, 3 Drawing Sheets

SELECTION OF THE PHASE USED TO COMMUNICATE BY PLC

The invention relates to the field of electricity meters.

BACKGROUND OF THE INVENTION

Modern electricity meters are so-called "smart" electronic meters, which are naturally designed to measure the electrical energy provided by a distributor to an electrical installation via a distribution network, but which are also capable of performing a certain number of additional functions: managing tariffs by receiving instructions, remote meter reading and programming, remote customer information, etc.

To communicate with the outside, and for example, with another meter, with a data concentrator, or with a server of the Information System (IS) of the energy distributor (optionally via another meter or a data concentrator), meters are conventionally provided with a communication module implementing communication by power-line communication (PLC).

Generally, all three-phase meters inject the PLC signals onto one same predetermined phase of the distribution network, which is traditionally phase 1. Consequently, in a meter network comprising only three-phase meters, all meters inject normally PLC signals onto the same phase, and the communication quality is normally satisfactory.

However, meter networks comprise both three-phase meters and single-phase meters. Yet, if the meter closest to a three-phase meter is a single-phase meter, which is connected onto a phase other than phase 1, the communication quality thus depends on the capacitive coupling between the cables, the quality of which can be very variable and very dependent on the environment.

OBJECT OF THE INVENTION

The object of the invention is to improve communication by power-line communication in an electricity meter network comprising both three-phase meters and single-phase meters.

SUMMARY OF THE INVENTION

In order to achieve this object, an electricity meter is proposed, arranged to measure electrical energy supplied to an installation by a distribution network comprising a plurality of phases, the electricity meter comprising:
  a communication module arranged to implement a communication by power-line communication;
  a switching circuit arranged to selectively connect the communication module to one of the phases;
  a processor unit arranged to control the switching circuit so as to connect the communication module to an optimised phase, from among the phases, which is selected dynamically to optimise a communication quality by power-line communication.

The processor unit of the meter according to the invention therefore controls the switching circuit such that it connects the communication module to the optimised phase, which is selected dynamically to optimise the communication quality.

Thus, whichever the meters located in the proximity of the meter according to the invention and with which the meter according to the invention communicates, whether these are three-phase or single-phase meters, the communication quality is always satisfactory.

In addition, an electricity meter such as described above is proposed, in which the processor unit is arranged, for each phase, to evaluate the communication quality by power-line communication, when the communication module is connected to said phase, and to select the optimised phase according to a result of this evaluation.

In addition, an electricity meter such as described above is proposed, the communication quality by power-line communication being evaluated according to at least one quality parameter comprising a signal to noise level and/or a frame exchange success rate.

In addition, an electricity meter such as described above is proposed, in which, when a PLC G3 technology is used to implement a communication by power-line communication, the signal to noise level is coded between 0 and 255, and in which, when a PLC PRIME technology is used to implement a communication by power-line communication, the signal to noise level is evaluated in dB.

In addition, an electricity meter such as described above is proposed, in which the processor unit is arranged to implement the following test and connection steps:
  controlling the switching circuit such that it connects successively the communication module to each phase;
  for each phase, when the communication module is connected to said phase, evaluating or acquiring the quality parameter;
  selecting as the optimised phase, the phase for which the quality parameter is maximum, and controlling the switching circuit such that it connects the communication module to said optimised phase.

In addition, an electricity meter such as described above is proposed, in which the processor unit is arranged to implement the test and connection steps at regular intervals.

In addition, an electricity meter such as described above is proposed, in which the processor unit is arranged to:
  evaluating or acquiring the quality parameter when the communication module is connected to a current phase;
  when the quality parameter becomes less than a predefined threshold, implementing the test and connection steps.

In addition, an electricity meter such as described above is proposed, in which the processor unit is arranged to receive a selection command transmitted by an external entity, to extract from the selection command, an identifier of the optimised phase which has been selected by the external entity, and to control the switching circuit so as to connect the communication module to said optimised phase.

In addition, an electricity meter such as described above is proposed, in which the switching circuit comprises, for each phase, a unitary circuit comprising:
  an input connected to the communication module, and an output connected to said phase;
  a switch circuit comprising two transistors and arranged to, selectively, cut off a connection between the input and the output, or enable said connection by letting positive and negative alternances of PLC signals emitted by or intended for the communication module pass through;
  a command circuit arranged to receive a primary command signal produced by the processor unit and to produce a secondary command signal to control the switch circuit.

In addition, a selection method is proposed, implemented in a meter such as described above, and comprising the following test and connection steps:
  controlling the switching circuit such that it connects successively the communication module to each phase;

for each phase, when the communication module is connected to said phase, evaluating or acquiring the quality parameter;

selecting as the optimised phase, the phase for which the quality parameter is maximum, and controlling the switching circuit such that it connects the communication module to said optimised phase.

In addition, a computer program is proposed, comprising instructions which cause the processor unit of the electricity meter such as described above to execute the steps of the selection method such as described above.

A computer-readable storage medium is further proposed, storing the computer program such as described above.

The invention will be best understood in the light of the following description of particular non-limiting embodiments of the invention.

BRIEF DESCRIPTION OF THE DRAWINGS

Reference will be made to the accompanying drawings, among which.

DETAILED DESCRIPTION OF THE INVENTION

Figure 1:
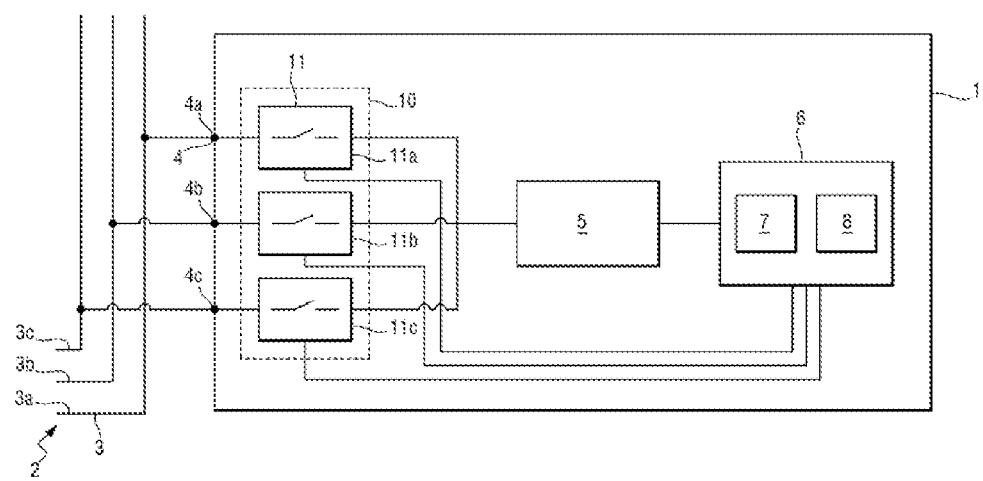
FIG. 1 represents an electricity meter according to the invention.

In reference to FIG. 1, the electricity meter 1 according to the invention is a three-phase meter which is intended to measure electrical energy supplied to the electrical installation of a subscriber by a distribution network 2.

The distribution network 2 comprises a plurality, in this case three phases 3 (and a neutral, not represented): a phase 3a, a phase 3b and a phase 3c. Phase 3a is phase 1 mentioned above.

The meter 1 comprises three input ports 4, each connected to one of the phases 3 of the distribution network: an input port 4a, an input port 4b and an input port 4c.

The meter 1 also comprises voltage sensors and current sensors (not represented), which measure, for each phase 3, the phase voltage present on said phase 3 and the phase current circulating over said phase 3.

The meter 1 in addition comprises a communication module 5 arranged to implement a communication by power-line communication (PLC). The communication module 5 is designed to inject outbound PLC signals on one of the phases 3 (which, as can be seen, is not the same systematically) and to acquire inbound PLC signals on said phase 3.

The meter 1 in addition comprises a processor unit 6, which is an electronic and software unit, and which comprises one or more processor components mounted on one or more electrical boards.

The processor component(s) comprise(s), for example, a "general" processor, a processer specialised in processing the signal (or DSP, Digital Signal Processor), a microcontroller, or indeed a programmable logic circuit such as an FPGA (Field Programmable Gate Array) or an ASIC (Application Specific Integrated Circuit). The processor components are adapted to executing program instructions. The processor unit 6 comprises, in this case in particular, the application microcontroller 7 of the meter 1.

The processor unit 6 also comprises one or more memories 8. At least one of the memories 8 forms a computer-readable storage medium 8, on which is stored a computer program comprising instructions which cause the processor unit 6 to execute at least some of the steps of the selection method which will be described below.

The meter 1 also comprises a switching circuit 10 which enables to selectively connect the communication module 5 to one of the phases.

The switching circuit 10 comprises, for each phase 3, a unitary circuit 11; there is therefore a unitary circuit 11a, a unitary circuit 11b and a unitary circuit 11c.

Figure 2:
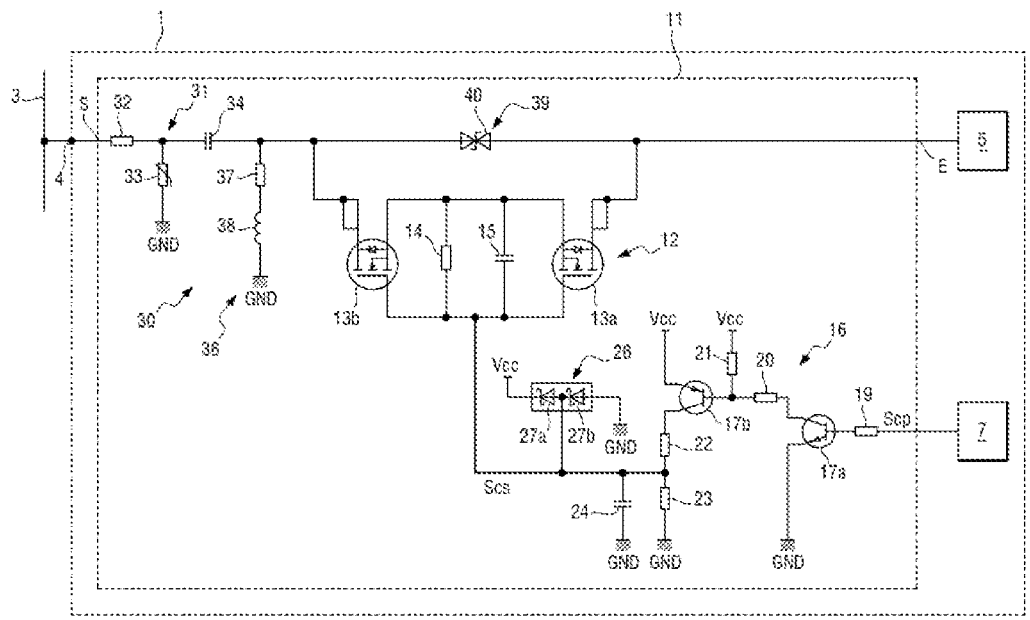
FIG. 2 represents the switching circuit.

In reference to FIG. 2, each unitary circuit 11 comprises an input E connected to an input/output of the communication module 5, and an output S connected to one (single) phase 3 via the associated input port 4.

The unitary circuit 11 also comprises a switch circuit 12, arranged to, selectively, cut off a connection between the input E and the output S of the unitary circuit 11, or enable said connection by letting positive and negative alternances of the outbound or inbound PLC signals, emitted from or to the communication module 5 pass through (the frequency of which is between 30 Khz and 500 Khz).

The switch circuit 12 comprises two MOSFET transistors 13a, 13b (at channel N).

The drain of the first transistor 13a is connected to the input E of the unitary circuit 11. The sources of the first transistor 13a and of the second transistor 13b are connected to one another. The gates of the first transistor 13a and of the second transistor 13b are connected to one another. A resistor 14 and a capacitor 15 are mounted in parallel and each have a first terminal connected to the sources, and a second terminal connected to the gates of the transistors 13a, 13b.

The unitary circuit 11 comprises, in addition, a command circuit 16 arranged to receive a primary command signal Scp produced by the microcontroller 7 and to produce a secondary command signal Scs to control the switch circuit 12.

The primary command signal Scp is, in the high state, a 3.3V voltage signal. The secondary command signal Scs is, in the high state, a 15V voltage signal. The command circuit 16 therefore adapts the primary command signal Scp to command the switch circuit 12.

The command circuit 16 comprises two bipolar transistors 17a, 17b: the transistor 17a is of the NPN type and the transistor 17b is of the PNP type.

The base of the transistor 17a is connected to an output of the microcontroller 7 via a resistor 19. The emitter of the transistor 17a is connected to the ground GND. The collector of the transistor 17a is connected to the base of the transistor 17b via a resistor 20. The base of the transistor 17b is connected to a power source VCC via a resistor 21. The power source Vcc supplies power under a direct voltage of 15V. The emitter of the transistor 17b is connected to the power source Vcc. The collector of the transistor 17b is connected to a first terminal of a resistor 22, a second terminal of which is connected to a first terminal of a resistor 23. The second terminal of the resistor 23 is connected to the ground.

The second terminal of the resistor 22 is also connected to a first terminal of a capacitor 24, a second terminal of which is connected to the ground. The second terminal of the resistor 22 is also connected to the gates of the transistors 13a, 13b.

The unitary circuit 11 also comprises a protective circuit 26 against surges of the command circuit, which protects voltage increases on the power source Vcc. The protective circuit 26 comprises two Schottky diodes 27a, 27b. The cathode of the Schottky diode 27a is connected to the power source Vcc. The cathode of the Schottky diode 27b is connected to the anode of the Schottky diode 27a. The anode of the Schottky diode 27b is connected to the ground. The anode of the Schottky diode 27a is connected to the gates of the transistors 13a, 13b.

The unitary circuit 11 also comprises a front circuit 30, connected to the output S of the unitary circuit 11 and therefore to the phase 3.

The front circuit 30 comprises a lightning protection circuit 31 (for example, at 2 kV) comprising a resistor 32 having a first terminal connected to the output S, and a varistor 33 having a first terminal connected to the ground and a second terminal connected to a second terminal of the resistor 32.

The front circuit 30 also comprises a coupling capacitor 34, making it possible to inject outbound PLC signals onto the phase 3. The coupling capacitor 34 blocks the 50 Hz, i.e. the frequency of the phase voltage and of the phase current. The coupling capacitor 34 has a first terminal connected to the second terminal of the resistor 32.

The front circuit 30 comprises, in addition, a "tank circuit" 36 which makes it possible to close the input circuit at 50 Hz when the switch circuit 12 is open, without impacting the high frequency signals (>10 Khz—and therefore the PLC signals) when the switch circuit 12 is closed.

The tank circuit 36 comprises a resistor 37 and an inductor 38. The resistor 37 has a first terminal connected to a second terminal of the coupling capacitor 34 and to the drain of the transistor 13b. The inductor 38 has a first terminal connected to the second terminal of the resistor 37 and a second terminal connected to the ground.

The unitary circuit 11 also comprises a protective circuit 39 against surges of the switch circuit 12 when it is open.

The protective circuit 39 comprises a two-directional Transil diode 40 having a first terminal connected to the input E of the unitary circuit 11 and to the drain of the transistor 13a, and a second terminal connected to the drain of the transistor 13b.

The protective circuit 39 makes it possible to limit the voltage to 10V at the terminals of the transistors 13a, 13b when they are open (blocked).

The unitary circuit 11 makes it possible to achieve the connection between the phase 3 of the distribution network 2 and the output of the communication module 5, through the protections described above. The primary command signal Scp, which comes from the microcontroller 7, makes it possible to control the two transistors 13a, 13b to enable or, on the contrary, prohibit the transit of PLC signals.

Consequently, when the microcontroller 7 produces, on its output, a primary command signal Scp at the high state, the unitary circuit 11 lets the PLC signals pass between the communication module 5 and the phase 3 which is therefore the phase selected to implement the PLC communication. On the contrary, when the microcontroller 7 produces on its output, a primary command signal Scp at the low state, the PLC communication is made on another phase. There is only one phase selected simultaneously.

The phase in question is selected to optimise the quality of the PLC communication: the "optimised" phase will be referred to.

In the meter 1, the microcontroller 7 can indeed evaluate the quality of the PLC communication when the communication module 5 is connected to each of the phases, and can therefore select dynamically the optimised phase according to the result of this evaluation. By "dynamically", this means that this selection can develop over time according to the development of the quality of the PLC communication.

The microcontroller 7 evaluates the quality of the PLC communication according to at least one quality parameter. The microcontroller 7 can evaluate (via measurements, calculations, etc.) the value of the quality parameter, or acquire said value.

The quality parameter is, for example, a signal to noise level.

When the PLC G3 technology is used to implement the PLC communication, the signal to noise level is coded between 0 and 255; thus LQI (Link Quality Indictor) is referred to.

When PLC PRIME technology is used to implement the PLC communication, the signal to noise level is evaluated in dB; thus SNR, Signal to Noise Ratio, is referred to.

The quality parameter is, for example, a frame exchange success rate.

Indeed, when it is connected to a data concentrator, the meter 1 receives conventionally information representative of the number of frames correctly transmitted by the meter 1 to said data concentrator over a predefined duration (24 hours, typically), which enables the meter 1 to know the frame exchange success rate, which is a good indicator of the quality of the PLC communication The meter 1 is thus capable of selecting the optimised phase, which itself will make it possible to communicate in PLC with the best quality possible.

The meter 1 can also be adapted by changing the phase to which the communication module 5 is coupled, according in particular to the topology of the network, followed for example, by adding new meters on the cluster.

Figure 3:
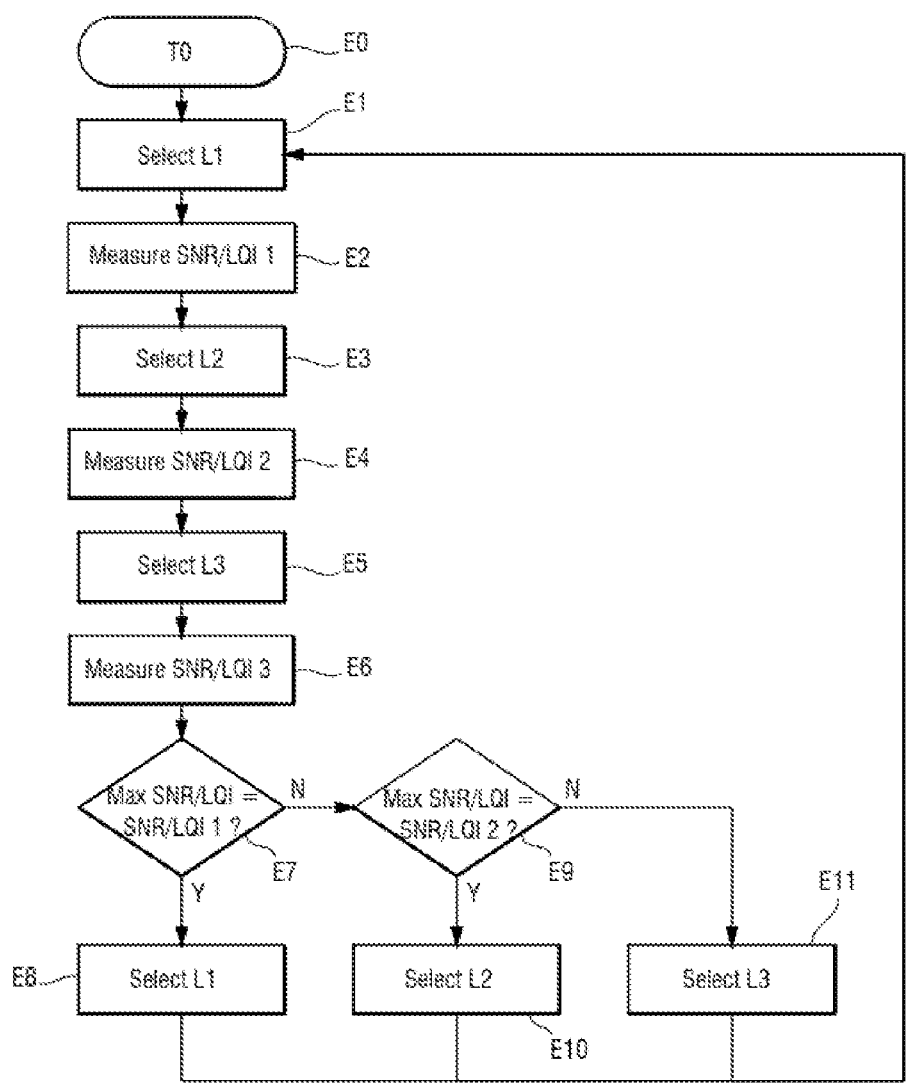
FIG. 3 represents steps of a selection method according to a first embodiment.

In reference to FIG. 3, a method for selecting the optimised phase is now described, according to a first embodiment.

The selection method comprises test and connection steps.

In the first embodiment of the selection method, the test and connection steps are carried out at regular intervals, daily for example, and consist of performing a scan of the three phases 3 in order to choose the one which is associated with the best quality parameter, then to connect the communication module 5 to the chosen phase.

During the test and connection steps, the microcontroller 7 controls the switching circuit 10 such that it connects successively the communication module 5 to each phase 3. Then, for each phase 3, when the communication module 5 is connected to said phase 3, the microcontroller 7 evaluates or acquires the quality parameter. The microcontroller 7 thus selects, as an optimised phase, the phase for which the quality parameter is maximum, and controls the switching circuit 10 such that it connects the communication module 5 to said optimised phase.

For example, it is considered that the quality parameter used is the SNR.

The selection method starts at time T0 (step E0).

The microcontroller 7 selects the phase 3a (step E1), i.e. that it controls the switching circuit 10 to enable the transmission of the PLC signals between the input and the output of the unitary circuit 11a associated with the phase 3a, and that it blocks this transmission for the other unitary circuits 11b, 11c.

The microcontroller 7 thus evaluates or acquires the SNR (step E2).

Then, the microcontroller 7 selects the phase 3b (step E3), and thus evaluates or acquires the SNR (step E4).

Then, the microcontroller 7 selects the phase 3*c* (step E5), and thus evaluates or acquires the SNR (step E6).

The microcontroller 7 thus verifies if the maximum value of the SNR is the SNR value obtained for phase 3*a* (step E7).

If this is the case, the microcontroller 7 selects the phase 3*a*, which is therefore the optimised phase to which the communication module 5 is connected for the following 24 hours (step E8). The microcontroller 7 thus waits for a duration T1=24 hours, then the method returns to step E1.

In step E7, if the maximum value of the SNR is not the SNR value obtained for phase 3*a*, the microcontroller 7 verifies if the maximum value of the SNR is the SNR value obtained for phase 3*b* (step E9).

If this is the case, the microcontroller 7 selects phase 3*b*, which is therefore the optimised phase to which the communication module 5 is connected for the following 24 hours (step E10). The microcontroller 7 thus waits for a duration T1=24 hours, then the method returns to step E1.

In step E9, if the maximum value of the SNR is not the SNR value obtained for phase 3*b*, the microcontroller 7 selects phase 3*c*, which is therefore the optimised phase to which the communication module 5 is connected for the following 24 hours (step E11). The microcontroller 7 thus waits for a duration T1=24 hours, then the method returns to step E1.

Figure 4:
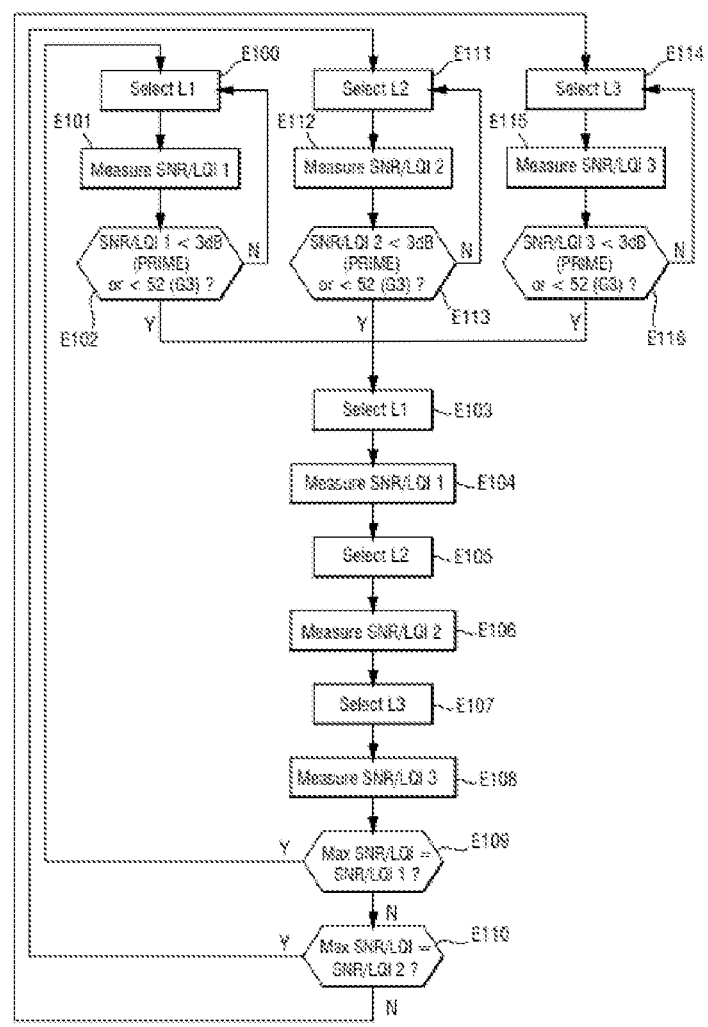
FIG. 4 represents steps of a selection method according to a second embodiment.

In a second embodiment, in reference to FIG. 4, the test and connection steps are only carried out when the communication quality is not satisfactory.

The microcontroller 7 evaluates or acquires the quality parameter when the communication module 5 is connected to a current phase. When the quality parameter becomes less than a predefined threshold, the microcontroller 7 implements the test and connection steps to select the optimised phase (which, initially, will be a phase different from the current phase).

This method assumes to select, by default, an optimised phase during the installation of the meter 1 (or during the initialisation of the program making it possible to implement the invention).

It is therefore considered that the current phase is phase 3*a*: the phase selected is phase 3*a* (step E100).

The microcontroller 7 thus evaluates or acquires the SNR (step E101).

The microcontroller 7 compares the SNR with a predefined threshold (for example, equal to 3 dB): step E102.

If the SNR is greater than or equal to the predefined threshold, the method returns to step E100.

If the SNR is less than the predefined threshold, the microcontroller 7 starts the test and connection steps.

The microcontroller 7 first selects phase 3*a* (step E103), and thus evaluates or acquires the SNR (step E104).

Then, the microcontroller 7 selects phase 3*b* (step E105), and thus evaluates or acquires the SNR (step E106).

Then, the microcontroller 7 selects phase 3*c* (step E107), and thus evaluates or acquires the SNR (step E108).

The microcontroller 7 thus verifies if the maximum value of the SNR is the SNR value obtained for phase 3*a* (step E109).

If this is the case, the microcontroller 7 selects phase 3*a*, which is the optimised phase to which the communication module 5 is thus connected (step E100). The microcontroller 7 thus waits for a duration T2=5 hours, then the method returns to step E101.

In step E109, if the maximum value of the SNR is not the SNR value obtained for phase 3*a*, the microcontroller 7 thus verifies if the maximum value of the SNR is the SNR value obtained for phase 3*b* (step E110).

If this is the case, the microcontroller 7 selects phase 3*b*, which is the optimised phase to which the communication module 5 is thus connected (step E111). The microcontroller thus waits for a duration T2=5 hours, then the method moves to step E112.

In step E112, the microcontroller 7 evaluates or acquires the SNR.

The microcontroller 7 compares the SNR with the predefined threshold (step E113).

If the SNR is greater than or equal to the predefined threshold, the method returns to step E111.

If the SNR is less than the predefined threshold, the microcontroller 7 starts the test and connection steps (E103 to E110).

In step E110, if the maximum value of the SNR is not the SNR value obtained for phase 3*b*, the microcontroller 7 selects phase 3*c*, which is the optimised phase to which the communication module 5 is thus connected (step E114). The microcontroller 7 thus waits for a duration T2=5 hours, then the method moves to step E115.

In step E115, the microcontroller 7 evaluates or acquires the SNR.

The microcontroller 7 compares the SNR with the predefined threshold (step E116).

If the SNR is greater than or equal with the predefined threshold, the method returns to step E114.

If the SNR is less than the predefined threshold, the microcontroller 7 starts the test and connection steps (E103 to E110).

The predetermined duration T2 makes it possible to maintain the stability of the topology of the network. Indeed, changing the coupling phase too often must be avoided. After each coupling phase change, a duration of a few hours must be respected before restarting a scan of the phases.

It is noted that, if the quality parameter used is not the SNR, but the LQI, the predefined threshold is, for example, equal to 52.

In the embodiments which have just been described, it is therefore the microcontroller 7 of the meter 1 which evaluates the quality of the PLC communication and which selects the optimised phase according to the result of this evaluation.

However, it is possible that the selection of the optimised phase is done externally to the meter 1, by an external entity.

This external entity is, for example, a server of the IS, or a data concentrator, and is connected to a plurality of meters.

The external entity acquires the values of the quality parameter associated with all these meters, and itself determines, for each meter 1, the optimised phase to be selected.

In this case, the microcontroller 7 of each meter 1 receives a selection command transmitted by the server of the IS, extracts from the selection command, an identifier of the optimised phase which has been selected by the server of the IS, and controls the switching circuit 10 to connect the communication module 5 to said optimised phase.

This solution has the following advantage with respect to the preceding one.

If it is the meter 1 which itself performs the selection, it is possible that, during the test and connection steps which have been described, one or more other meters themselves also start test and connection steps—which can tend to modify the result of the selection for the meter 1.

The cluster of meters can thus take quite a long time to stabilise.

However, if the selection is made in an overall and centralised manner by an external entity, this external entity can sequence the connection operations, which reduces the stabilisation time.

It will however be noted that, if the selection is made at each meter, this selection is possibly more stable and can make it possible to result in a permanent stabilisation.

Naturally, the invention is not limited to the embodiments described, but covers any variant coming within the scope of the invention such as defined by the claims.

The quality parameter used is not necessarily the same systematically. Each meter could choose dynamically the best parameter to be used (which is, for example, that which gives values furthest from the predefined threshold).

The quality parameter can also be chosen dynamically by an entity centralised on the basis of observations made on a plurality of meters.

It is also possible to use several quality parameters, either to confirm the result of the selection of the optimised phase, or to produce a combined parameter from several quality parameters. The combined parameter is, for example, obtained by a weighted average of the quality parameters.

The invention claimed is:

1. An electricity meter, arranged to measure electrical energy supplied to an installation by a distribution network comprising a plurality of phases, the electricity meter being arranged to implement a communication by power-line communication, and comprising:
   a switching circuit arranged to selectively connect the communication module to one of the phases; and
   a processor unit arranged to control the switching circuit so as to connect the communication module to an optimized phase, from among the phases, which is selected dynamically to optimize a quality of the communication by power-line communication,
   wherein the processor unit is arranged, for each phase, to evaluate the quality of the communication by power-line communication, when the communication module is connected to said phase, and to select the optimized phase according to a result of this evaluation,
   wherein the quality of the communication by power-line communication is evaluated according to at least one quality parameter comprising a signal to noise level and/or a frame exchange success rate,
   wherein the processor unit is arranged to implement the following test and connection steps:
      controlling the switching circuit such that it connects successively the communication module to each phase;
      for each phase, when the communication module is connected to said phase, evaluating or acquiring the quality parameter;
      selecting as the optimized phase, the phase for which the quality parameter is maximum, and controlling the switching circuit such that it connects the communication module to said optimized phase, and
   wherein the processor unit is arranged to:
      evaluate or acquire the quality parameter when the communication module is connected to a current phase; and
      when the quality parameter becomes less than a predefined threshold, implement the test and connection steps.

2. The electricity meter according to claim 1, wherein, when a PLC G3 technology is used to implement the communication by power-line communication, the signal to noise level is coded between 0 and 255, and wherein, when a PLC PRIME technology is used to implement the communication by power-line communication, the signal to noise level is evaluated in dB.

3. The electricity meter according to claim 1, wherein the processor unit is arranged to implement the test and connection steps at regular intervals.

4. The electricity meter according to claim 1, wherein the processor unit is arranged to receive a selection command transmitted by an external entity, to extract an identifier of the optimized phase from the selection command, which has been selected by the external entity, and to control the switching circuit so as to connect the communication module to said optimized phase.

5. The electricity meter according to claim 1, wherein the switching circuit comprises, for each phase, a unitary circuit comprising:
   an input connected to the communication module, and an output connected to said phase;
   a switch circuit comprising two transistors and arranged to, selectively, cut off a connection between the input and the output, or enable said connection by letting positive and negative alternances of PLC signals emitted from or to the communication module pass through;
   a command circuit arranged to receive a primary command signal (Scp) produced by the processor unit and to produce a secondary command signal (Scs) to control the switch circuit.

6. A selection method, implemented in the meter according to claim 1, and comprising the following test and connection steps:
   controlling the switching circuit such that it connects successively the communication module to each phase;
   for each phase, when the communication module is connected to said phase, evaluating or acquiring the quality parameter;
   selecting as the optimized phase, the phase for which the quality parameter is maximum, and controlling the switching circuit such that it connects the communication module to said optimized phase.

7. A non-transitory, computer-readable storage medium, on which a computer program is stored, the computer program comprising instructions which cause the processor unit of the electricity meter according to claim 1, to execute a selection method, comprising the following test and connection steps:
   controlling the switching circuit such that it connects successively the communication module to each phase;
   for each phase, when the communication module is connected to said phase, evaluating or acquiring the quality parameter;
   selecting as the optimized phase, the phase for which the quality parameter is maximum, and controlling the switching circuit such that it connects the communication module to said optimized phase.

* * * * *